United States Patent [19]

Baier et al.

[11] Patent Number: 4,638,341

[45] Date of Patent: Jan. 20, 1987

[54] GATED TRANSMISSION LINE MODEL STRUCTURE FOR CHARACTERIZATION OF FIELD-EFFECT TRANSISTORS

[75] Inventors: Steven M. Baier; Nicholas C. Cirillo, Jr.; Steven A. Hanka, all of Minneapolis; Michael S. Shur, Golden Valley, all of Minn.

[73] Assignee: Honeywell Inc., Minneapolis, Minn.

[21] Appl. No.: 647,769

[22] Filed: Sep. 6, 1984

[51] Int. Cl.$^4$ .................... H01L 29/48; H01L 29/56; H01L 29/64

[52] U.S. Cl. .................... 357/15; 357/55; 357/45; 357/40; 307/304; 324/78 R; 324/178

[58] Field of Search ............... 357/15 M, 15 P, 15 G, 357/15 A, 41, 45, 55, 22, 5, 91, 40, 85; 307/304; 324/78 R, 178 R

[56] References Cited

U.S. PATENT DOCUMENTS

| | | | |
|---|---|---|---|
| 4,160,259 | 7/1979 | Nishizawa | 357/22 |
| 4,266,333 | 5/1981 | Reichert | 357/15 X |
| 4,286,276 | 8/1981 | Diamond | 357/15 X |
| 4,336,495 | 6/1982 | Hapke | 324/158 R X |
| 4,422,087 | 12/1983 | Ronen | 357/15 |
| 4,430,583 | 2/1984 | Shoji | 307/304 X |
| 4,459,556 | 7/1984 | Nanbu et al. | 357/22 X |
| 4,459,605 | 7/1984 | Rice | 357/22 |

FOREIGN PATENT DOCUMENTS 55-65477   5/1980   Japan ................ 357/22 S

OTHER PUBLICATIONS

H. Fukui, "Determination of the Basic Device Parameters of a GaAs MESFET", Bell Sys. Tech. Journal, pp. 771–797, Mar. '79.

K. Lee et al., "Low Field Mobility in GaAs Ion-implanted FETs", IEEE Ed-31, No. 3, pp. 390–393, Mar. '84.

Osburn, "Measuring Breakdown Voltage Distribution of an Array of MOSFET's", *IBM Technical Disclosure Bulletin*, vol. 14, No. 2, Jul. 1971, pp. 502–503.

Fukui, "Determination of the Basic Device Parameters of a GaAs MESFET", *The Bell System Technical Journal*, vol. 58, No. 3, Mar. 1979, pp. 779–781.

Chen et al., "Schottky Transistor Logic Base Extension Cell," *IBM Technical Disclosure Bulletin*, vol. 20, No. 1, Jun. 1977, pp. 182–183.

Primary Examiner—Martin H. Edlow
Assistant Examiner—William A. Mintel
Attorney, Agent, or Firm—Omund R. Dahle

[57] ABSTRACT

The gated Transmission Line Model (GTLM) structure is a novel characterization device and measurement tool for integrated circuit process monitoring. This test structure has Schottky gates between the ohmic contacts of a TLM pattern. The gate lengths are varied and the gate-to-ohmic separations are kept constant to provide an accurate determination of several important FET channel parameters. It offers a precise method for measuring the FET source resistance which requires no parameter fitting and which works equally well on planar, self-aligned gate, and recessed gate FET's. In addition, the GTLM structure offers the only available means to measure sheet resistance of enhancement-mode FET channels. The gated-TLM structure can also be used to find the effective free surface potential. The structure may be combined with capacitance-voltage analysis or geometric magnetoresistance analysis to create mobility and doping profile of actual FET channels. Further, the GTLM structure may be implemented in any existing semiconductor FET technology, including silicon, GaAs, and modulation-doped structures.

12 Claims, 4 Drawing Figures

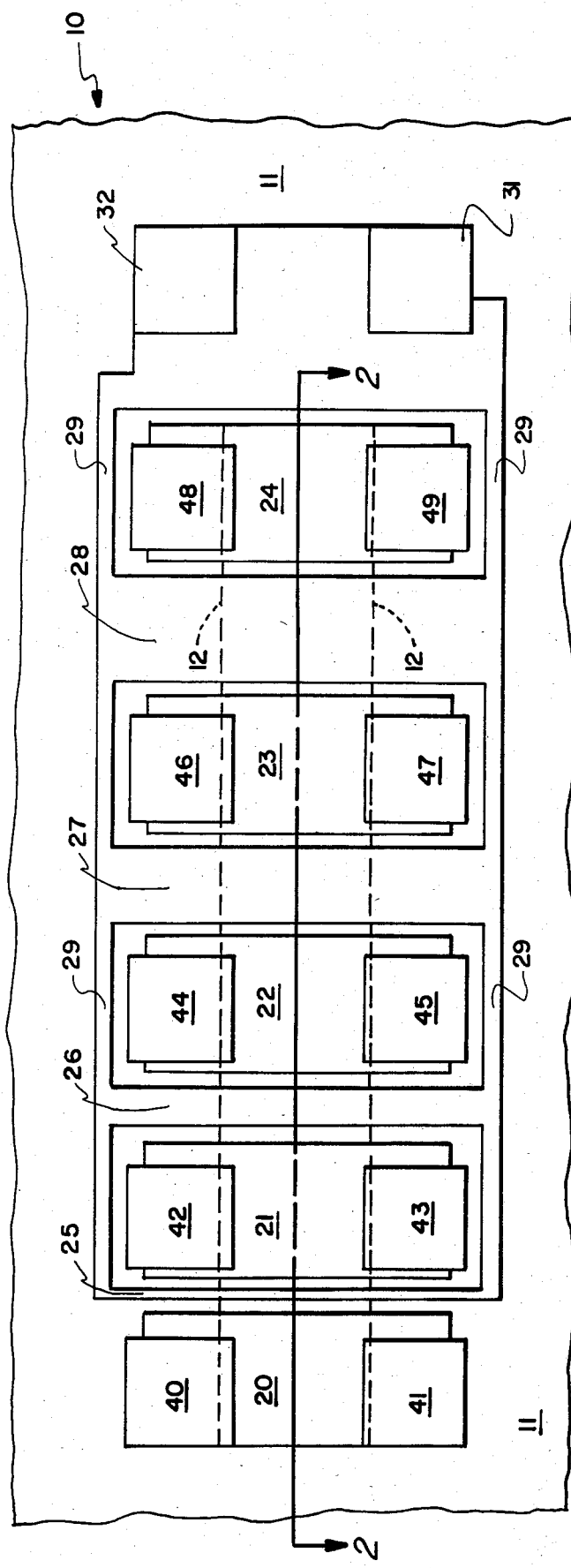
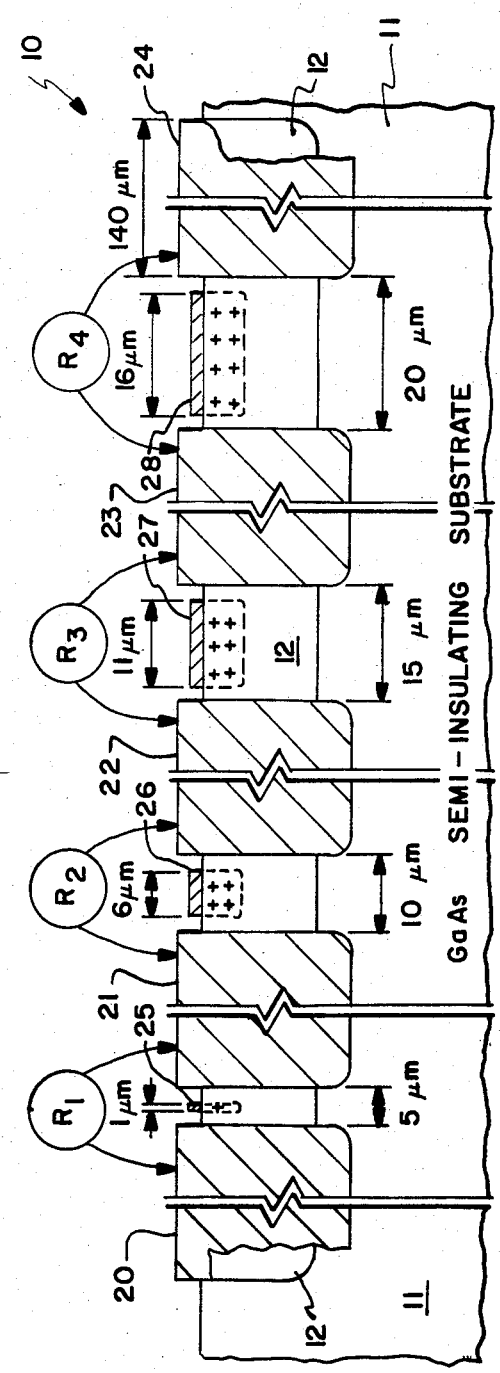

$R_{TOTAL,i} = 2R_C + 2R_p + R_{CH,i}(V_{gs})$, $i = 1,4$

GATED TRANSMISSION LINE MODEL STRUCTURE FOR CHARACTERIZATION OF FIELD-EFFECT TRANSISTORS

BACKGROUND AND SUMMARY OF THE INVENTION

In the design and manufacture of FET integrated circuits it is desirable to monitor the characteristics of the active channel of devices comprising the circuit. The present invention, useful in the integrated circuit art, is a gated transmission line model (GTLM) structure which provides a unique characterization device for accurately determining a variety of such parameters.

In the field effect transistor art, Transmission Line Model (TLM) measurements are a standard technique for the determination of the contact resistance and sheet resistance of the active layer.

In this invention the test structure has Schottky gates between the ohmic contacts of a conventional transmission line model (TLM) pattern, and the new test pattern is hereafter referred to as a gated-TLM or GTLM pattern. The gate lengths are different, one from the next, and the gate-to-ohmic separations are kept constant. With this structure the series resistance is nearly independent of the gate voltage and the channel resistance is modulatable by the gate voltage to provide an accurate determination of FET channel parameters.

At present there is no way to measure sheet resistance of the active layer of an enhancement-mode FET due to complete surface depletion. Since the GTLM structure can modulate the extent of this depletion, it offers a way to characterize enhancement-mode channels.

In addition to channel resistance, the parasitic source resistance is an important parameter to know, both for digital and (especially so) for low-noise analog FET applications.

A reference H. Fukui "Determination of the basis device parameters of a GaAs MESFET", Bell Sys. Tech. Journal, pp. 771-797, March 1979, shows a technique used to deduce source resistance Rs. The drain-to-source resistance Rds of a FET is measured at small Vds and plotted versus $[(Vbi-Vgs)/Vpo]-0.5$ where Vbi is built in junction voltage, Vgs is gate voltage and Vpo is pinch-off voltage. Vpo is arbitrarily adjusted to get a good linear fit and the Y-intercept of a least-squares regression to the data is used as 2Rs. The value of Rs determined in this way, however, varies significantly as Vpo is adjusted and therefore the method does not give accurate results. Also, the data is taken on a single FET so there is no way to average out any device peculiarities. Therefore this technique only provides an estimate for Rs.

The GTLM structure offers a means to deduce the source resistance with no parameter-fitting involved. In addition, the GTLM works equally well on planar, recessed-gate, and modulation-doped structures where other methods will fail due to undesirable current paths.

A reference K. Lee, et al, "Low field mobility in GaAs ion-implanted FETs," IEEE ED-31, No. 3, pp. 390-393, March 1984, shows a technique used to obtain mobility profiles. Measurements of low-field FET channel resistance and transconductance versus gate voltage are used together with a numerical solution of $$g_m = \frac{\epsilon W V_{ds}}{L} \frac{N(x)}{x} \left(\frac{R_{ch}}{R_T}\right)^2$$

to profile the mobility. This method requires a fitting parameter (Rs) to be adjusted in an iteration scheme with an assumed doping profile. Therefore the results will be an approximation. Also, the area of the device under test is generally too small to permit CV analysis. The GTLM structure deduces Rs automatically and therefore can use an iteration scheme to additionally deduce the doping profile.

BRIEF DESCRIPTION OF THE DRAWINGS

FIG. 1 discloses a top view of the gated Transmission Line Model structure.

FIG. 2 is a side view or cross section of FIG. 1.

DESCRIPTION

Figure 3:
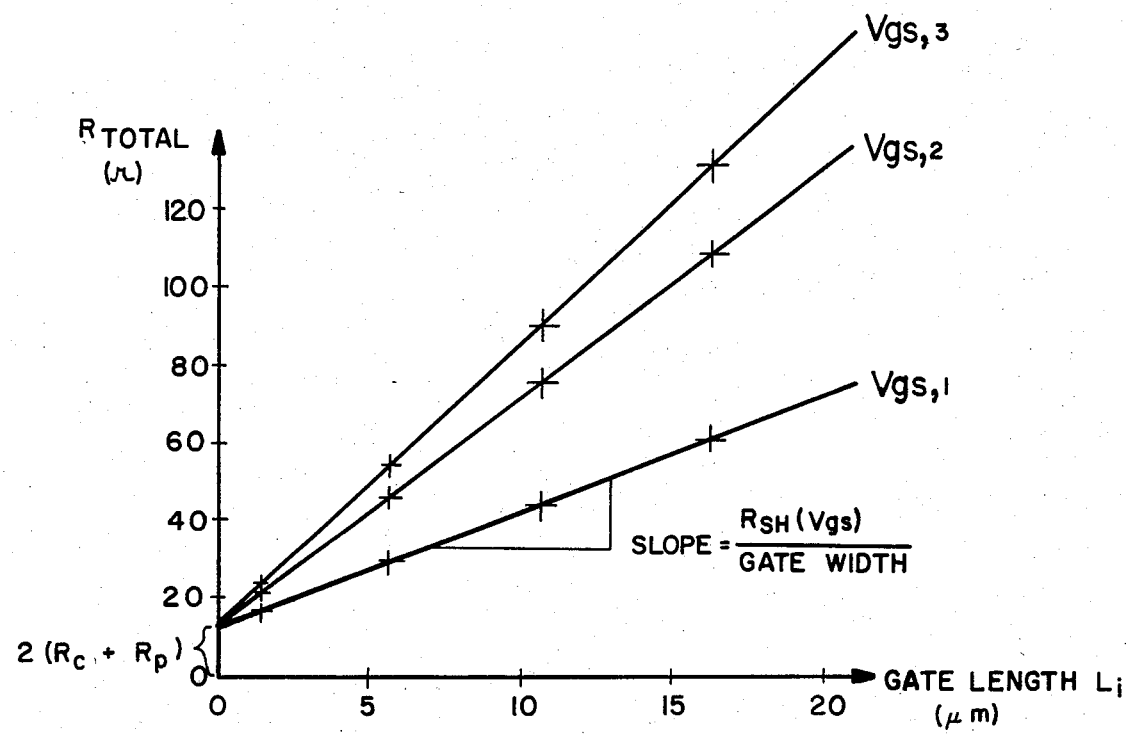
FIG. 3 is a graphical presentation of certain data analysis of the structure.

Referring now to FIGS. 1 and 2 there is shown a gated-TLM structure 10 on a semiconductor substrate 11. As is most clearly shown in FIG. 2 which presents a side view of the gated-TLM pattern, there is disclosed a plurality of alloyed ohmic contacts 20, 21, 22, 23 and 24. The ohmic contacts are deposited on the wafer atop an implant or grown layer 12 identical to that of neighboring circuit FET's. These five ohmic contacts have been spaced apart by differing distances, one from the other. In this example, the ohmic metal contacts 20 and 21 are spaced apart by 5 μm, contacts 21 and 22 by 10 μm, contacts 22 and 23 by 15 μm and contacts 23 and 24 by 20 μm. Each of the ohmic contacts includes pads for probe contact identified in FIG. 1 as pads 40 to 49. Between the spaced contacts a Schottky metal is deposited to form gates and in FIG. 2 these gates are identified at 25, 26, 27 and 28. Each of the Schottky gates is of a different length dimension, that is, gate 25 is 1 μm long, gate 26 is 6 μm long, gate 27 is 11 μm long and gate 28 is 16 μm long. These gate lengths match with the related ohmic contact spacings so that the gate-to-ohmic spacings are all kept constant (that is, 2 μm in this example), and are identical to those of circuit FET's. The four gates 25, 26, 27 and 28 are connected together by conductive path 29 and to contact pads 32 and 31 as best illustrated in FIG. 1.

With the gate lengths varied and the gate-to-ohmic separations kept constant, the series resistance is nearly independent of the gate voltage and the channel resistance may be modulated by the gate voltage. This allows an accurate determination of FET channel parameters including source resistance, electron mobility profile, and doping profile.

To measure the source resistance, a four-point resistance measurement is performed at each ohmic spacing (see FIG. 2). The voltage between the ohmics must be kept much smaller than the saturation voltage of the active channel. These resistances $R_{TOTAL,i}$ are plotted versus their respective gate lengths and a least-squares regression is performed to find the Y-intercept (see FIG. 3). This Y-intercept is equal to $2(Rc+Rp)$ or precisely twice the source resistance. In the resistance model of the gated-TLM structure shown in FIG. 4, $R_c$=resistance of the contact, $R_p$=parasitic ohmic-to-channel resistance and $R_{ch}(Vgs)$=channel resistance modulated by gate voltage. Since the Y-intercept should be constant with respect to gate voltage, we can take the four-point resistance measurements at several gate voltages and compare the results as a check of our method.

Figure 4:
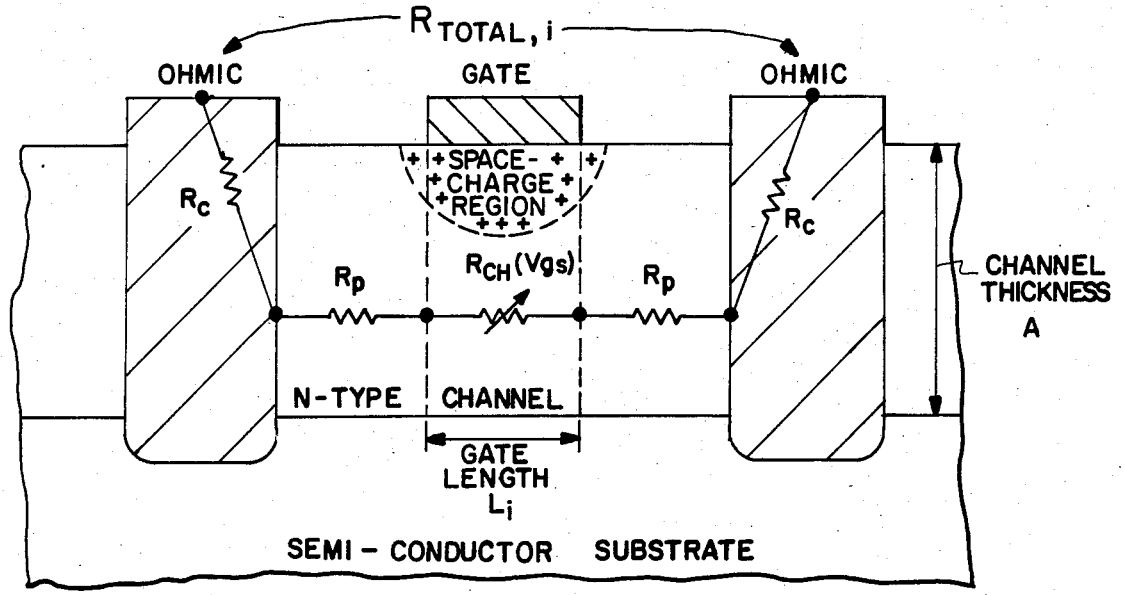
FIG. 4 is a simple resistance model of the gated TLM structure.

The gated-TLM structure can be used to measure the effective free surface potential by varying the gate voltage until the slope of the line in FIG. 3 is identical to that of a conventional TLM pattern fabricated over a similar active channel. The gate voltage Vgs necessary to cause identical slopes is then equal to the difference between effective free surface potential $\phi_s$ divided by electronic charge q and the built-in junction voltage Vbi, i.e.

$$Vgs = \frac{\phi_s}{q} - Vbi.$$

The electron mobility profile and doping profile may be obtained by measuring the sheet resistance $R_{SH}(Vgs)$ of the active channel (slope of line in FIG. 3) as a function of gate voltage. This data is combined with conventional CV (capacitance-voltage) analysis of the largest Schottky pad (which determines X(Vg) and N(X)) to calculate the mobility profile using a numerical solution of $$R_{SH}^{-1}(Vgs) = q \int_x^A \mu(x')N(x')dx'$$

where
Vgs=gate voltage
N=electron impurity concentration
$R_{SH}$=sheet resistance of active channel in ohms/square
A=thickness of channel
$\mu$=electron mobility
x=distance into channel from surface The sheet resistance versus gate voltage data from gated-TLM may also be combined with conventional geometric magnetoresistance (GMR) measurements to find the mobility profile directly, although this requires use of an electromagnet.

Referring once again to FIGS. 1 and 2, it will be appreciated that in the drawing the ohmic metal contacts 20, 21, 22, 23 and 24 (not to scale) have been shown in a foreshortened way for illustration. In FIG. 2 each of the contacts 20, 21, 22, 23 and 24 is shown as broken and an exemplary length for each of the ohmic contacts of 140 microns is shown on the drawing at contact 24. Thus the actual length of each of the ohmic metal contacts is much longer than appears in FIGS. 1 and 2 and said ohmic contact length is also much longer than the spaces.

The embodiments of the invention in which an exclusive property or right is claimed are defined as follows:

1. A gated transmission line model TLM pattern for use in field-effect transistor characterization, comprising:
    a semiconductor substrate having a major surface which has a conducting channel of uniform width formed into and along a region on said surface;
    a plurality of at least four spaced ohmic contacts deposited on the substrate surface at and along said conducting channel region;
    wherein a first space between a first and a second of said ohmic contacts is a different dimension from a second space between the second and a third of said ohmic contacts, and a third space between said third and fourth of said ohmic contacts is a different dimension from the first and second spaces;
    a plurality of at least three Schottky metal gates deposited on said surface, one gate being deposited, respectively, in each of said spaces between the plurality of ohmic contacts, the dimension of the gate being smaller than the dimension of the space it is in to establish a gate-to-ohmic spacing,
    whereby the plurality of Schottky metal gates includes a first, a second and a third gate positioned in said first, second and third spaces, respectively, with the length of each of said gates being x (where x is a number) microns smaller than the dimension of the related space so that the gate-to-ohmic spacing remains the same in each of said spaces.

2. The gated-TLM pattern according to claim 1 in which $x \geq 1.0$ $\mu$m.

3. The gated-TLM pattern according to claim 2 in which x is in the range of 1 to 4 $\mu$m.

4. A gated transmission line model (TLM) pattern for use in ion-implanted GaAs field-effect transistor characterization, comprising:
    a gallium-arsenide semi-insulating substrate wafer which has implanted into a surface thereon an elongate n-type channel of uniform width;
    a plurality of at least four spaced ohmic contacts deposited on the wafer surface at said n-type channel positions,
    wherein a first space between a first and a second of said ohmic contacts is a different dimension from a second space between the second and a third of said ohmic contacts, and a third space between said third and a fourth of said ohmic contacts is a different dimension from the first and second spaces;
    a plurality of at least three Schottky metal gates deposited on said surface, one gate being deposited, respectively, in each of said spaces between the plurality of ohmic contacts, the dimension of the gate being smaller than the dimension of the space it is in to establish a gate-to-ohmic spacing,
    whereby the plurality of Schottky metal gates includes a first, a second and a third gate positioned in said first, second and third spaces, respectively, with the length of each of said gates being x (where x is a number) microns smaller than the space dimension so that the gate-to-ohmic spacing remains the same in each of said spaces.

5. The gated-TLM pattern according to claim 4 in which $x \geq 1.0$ $\mu$m.

6. The gated-TLM pattern according to claim 5 in which x is in the range of 1 to 4 $\mu$m.

7. A gallium-arsenide wafer upon which integrated circuits utilizing field-effect transistors are fabricated, the wafer including a gated transmission line model (TLM) pattern for use in characterization of the field-effect transistors making up the integrated circuits, the gated-TLM comprising:
    a plurality of ohmic contacts, differently spaced one from the other, deposited on the surface of a gallium-arsenide substrate wafer, each space having a different dimension;
    a plurality of Schottky metal gates deposited in the spaces between said ohmic contacts, one gate being deposited, respectively, in each space between the plurality of ohmic contacts, and in which the length of the Schottky metal gate is x (where x is a number) microns smaller than the related space dimension establishing a gate-to-ohmic spacing so that the gate-to-ohmic spacing remains the same in each of said spaces.

8. The gated-TLM pattern according to claim 7 in which $x \geq 1.0$ μm.

9. The gated-TLM pattern according to claim 8 in which x is in the range of 1 to 4 μm.

10. Apparatus for detecting the source resistance, and behavior of sheet resistance vs. gate voltage in semiconductor active channels, comprising:

a gated transmission line model (TLM) pattern including a plurality of spaced ohmic contacts deposited on the surface of a semiconductor active channel, the ohmic contacts being differently spaced one from the other wherein each space has a different dimension;

a plurality of Schottky metal gates centered in the spaces between said ohmic contacts, one gate being deposited, respectively, in each space, and in which the length of the Schottky metal gate is x (where x is a number) microns smaller than the related space dimension thereby establishing a gate-to-ohmic spacing so that the gate-to-ohmic spacing remains the same in each of said spaces;

means including a first probe pad connecting said plurality of gates together;

upper and lower probe pads on each of said ohmic contacts;

means for applying a gate bias potential to said first probe pad;

constant current means;

probe means connecting said constant current means to the upper probe pad of adjacent ohmic contacts;

and means for reading the potential between the lower probe pad of said adjacent ohmic contacts.

11. The gated-TLM pattern according to claim 10 in which $x \geq 1.0$ μm.

12. The gated-TLM pattern according to claim 11 in which x is in the range of 1 to 4 μm.

* * * * *